(12) United States Patent
Liu et al.

(10) Patent No.: US 11,482,526 B1
(45) Date of Patent: Oct. 25, 2022

(54) MANUFACTURING METHOD OF MEMORY

(71) Applicant: CHANGXIN MEMORY TECHNOLOGIES, INC., Hefei (CN)

(72) Inventors: Hao Liu, Hefei (CN); Qiang Wan, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 17/453,038

(22) Filed: Nov. 1, 2021

Related U.S. Application Data

(63) Continuation of application No. PCT/CN2021/110999, filed on Aug. 5, 2021.

(30) Foreign Application Priority Data

May 14, 2021 (CN) .......................... 202110527256.8

(51) Int. Cl.
*H01L 27/108* (2006.01)
(52) U.S. Cl.
CPC .. *H01L 27/10888* (2013.01); *H01L 27/10823* (2013.01); *H01L 27/10894* (2013.01); *H01L 27/10897* (2013.01)
(58) Field of Classification Search
None
See application file for complete search history.

(56) References Cited

U.S. PATENT DOCUMENTS

| | | | | |
|---|---|---|---|---|
| 11,037,930 B2 * | 6/2021 | Park | .................. | H01L 27/10814 |
| 11,309,316 B1 * | 4/2022 | Chen | .................. | H01L 27/10823 |
| 2014/0154882 A1 * | 6/2014 | Kim | .................. | H01L 27/10885 |
| | | | | 438/672 |
| 2015/0241771 A1 | 8/2015 | Hong et al. | | |
| 2018/0342520 A1 | 11/2018 | Chun | | |

FOREIGN PATENT DOCUMENTS

| | | |
|---|---|---|
| CN | 111640749 A | 9/2020 |
| CN | 112054027 A | 12/2020 |
| CN | 112530946 A | 3/2021 |
| CN | 112563208 A | 3/2021 |

OTHER PUBLICATIONS

International Search Report and English Translation cited in PCT/CN2021/110999, dated Feb. 7, 2022, 9 pages.
Written Opinion and English Translation cited in PCT/CN2021/110999, dated Feb. 7, 2022, 6 pages.

* cited by examiner

*Primary Examiner* — Steven M Christopher
(74) *Attorney, Agent, or Firm* — Cooper Legal Group, LLC

(57) ABSTRACT

The present application provides a manufacturing method of a memory. The manufacturing method includes: providing a substrate, where the substrate includes a core region and a peripheral region, and a first barrier layer is provided in the core region; laminating and forming a first conductive layer and a first mask layer on the substrate in sequence; etching the first mask layer, the first conductive layer, and the first barrier layer in the core region, to form a first etched hole; etching the substrate along the first etched hole, to form a bit line contact hole; removing the first mask layer and the first conductive layer in the core region and located around the bit line contact hole; and forming a bit line contact in the bit line contact hole.

15 Claims, 14 Drawing Sheets

US 11,482,526 B1

MANUFACTURING METHOD OF MEMORY

CROSS-REFERENCE TO RELATED APPLICATIONS

This is a continuation of International Patent Application No. PCT/CN2021/110999, filed on Aug. 5, 2021, which claims the priority to Chinese Patent Application No. 202110527256.8, titled "MANUFACTURING METHOD OF MEMORY" and filed to the China National Intellectual Property Administration on May 14, 2021. The entire contents of International Patent Application No. PCT/CN2021/110999 and Chinese Patent Application No. 202110527256.8 are incorporated herein by reference.

TECHNICAL FIELD

The present application relates to the technical field of semiconductors, and in particular, to a manufacturing method of a memory.

BACKGROUND

With gradual development of storage device technologies, a dynamic random access memory (DRAM) is widely used in various electronic devices due to its high density and fast reading/writing speed. A DRAM usually includes a plurality of memory cells. Each memory cell includes a transistor and a capacitor. A gate of the transistor is electrically connected to a word line, a source of the transistor is electrically connected to a bit line, and a drain of the transistor is electrically connected to the capacitor. A word line voltage on the word line can control on or off of the transistor, such that data information stored in the capacitor can be read through the bit line or data information can be written to the capacitor.

During manufacturing of a memory, a void or a seam is easily formed within a bit line contact, resulting in performance degradation of the memory.

SUMMARY

Embodiments of the present application provide a manufacturing method of a memory, where the manufacturing method includes: providing a substrate, where the substrate includes a core region and a peripheral region located outside the core region, a plurality of active regions are arranged at intervals in the core region, and a first barrier layer is further provided in the core region; laminating and forming a first conductive layer and a first mask layer on the substrate in sequence; etching the first mask layer, the first conductive layer, and the first barrier layer which are in the core region, to form a first etched hole penetrating through the first mask layer, the first conductive layer, and the first barrier layer, where the first etched hole is opposite to the active region; etching the substrate along the first etched hole, to form a bit line contact hole, where the bit line contact hole exposes the active region; removing the first mask layer and the first conductive layer which are in the core region and located around the bit line contact hole, and retaining the first barrier layer located around the bit line contact hole; and forming a bit line contact in the bit line contact hole, where the bit line contact is electrically connected to the active region, and a surface of the bit line contact away from the substrate is flush with a surface of the first barrier layer away from the substrate.

DETAILED DESCRIPTION

Figure 1:
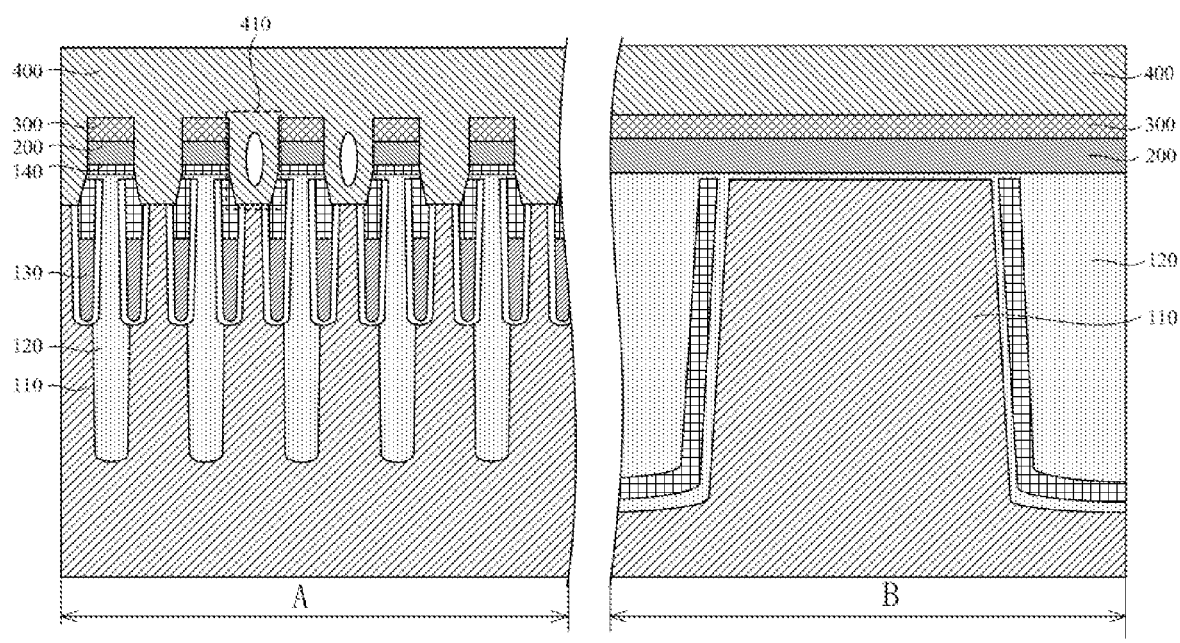
FIG. 1 is a schematic structural diagram after formation of a bit line contact in the related art.

The inventor of the present application found in actual work that, referring to FIG. 1, during deposition of a second conductive layer 400, a bit line contact 410 is formed in the second conductive layer 400 located in a bit line contact hole, and a void or a seam easily occurs in the bit line contact 410. As shown by dotted lines in FIG. 1, the void or the seam affects performance of the bit line contact 410, resulting in performance degradation of a memory.

In view of the foregoing technical problem, an embodiment of the present application provides a manufacturing method of a memory. A first mask layer and a first conductive layer around a bit line contact hole in a core region are removed, such that a total depth of a first etched hole and the bit line contact hole is reduced, thereby reducing a formation height of a bit line contact, reducing or even avoiding formation of a void or a seam in the bit line contact, improving a capability of the bit line contact to transmit a charge, and improving performance of the memory.

In order to make the objectives, features and advantages of the embodiments of the present application clearer, the technical solutions in the embodiments of the present application are described clearly and completely below with reference to the accompanying drawings in the embodiments of the present application. Apparently, the described embodiments are some rather than all of the embodiments of the present application. All other embodiments obtained by a person of ordinary skill in the art based on the embodiments of present application without creative efforts should fall within the protection scope of this application.

Figure 2:
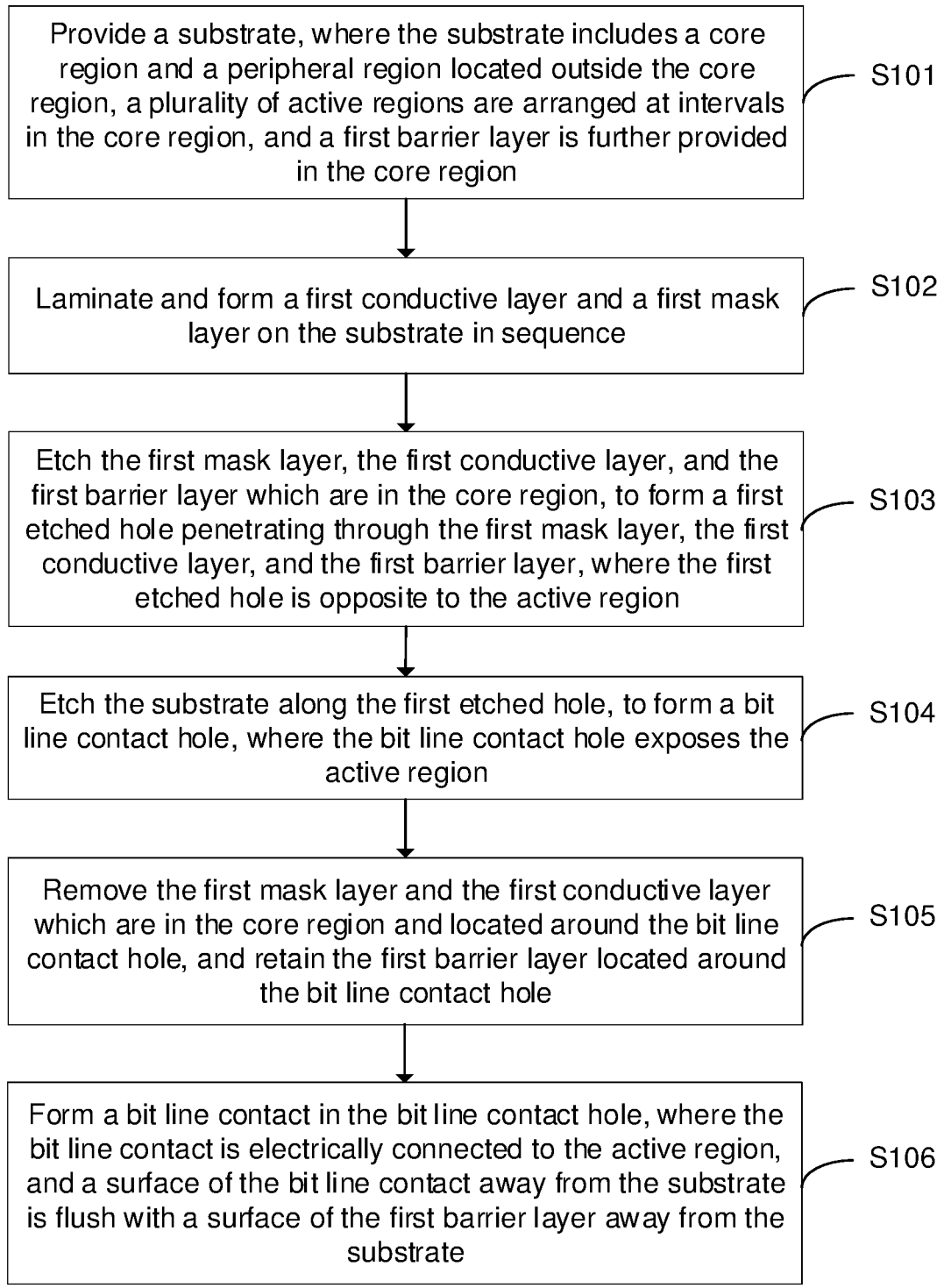
FIG. 2 is a flowchart of a manufacturing method of a memory according to an embodiment of the present application.

FIG. 2 shows a procedure of a manufacturing method of a memory according to an embodiment of the present application. The manufacturing method includes the following steps:

Step S101. Provide a substrate, where the substrate includes a core region and a peripheral region located outside the core region, a plurality of active regions are arranged at intervals in the core region, and a first barrier layer is further provided in the core region.

Figure 3:
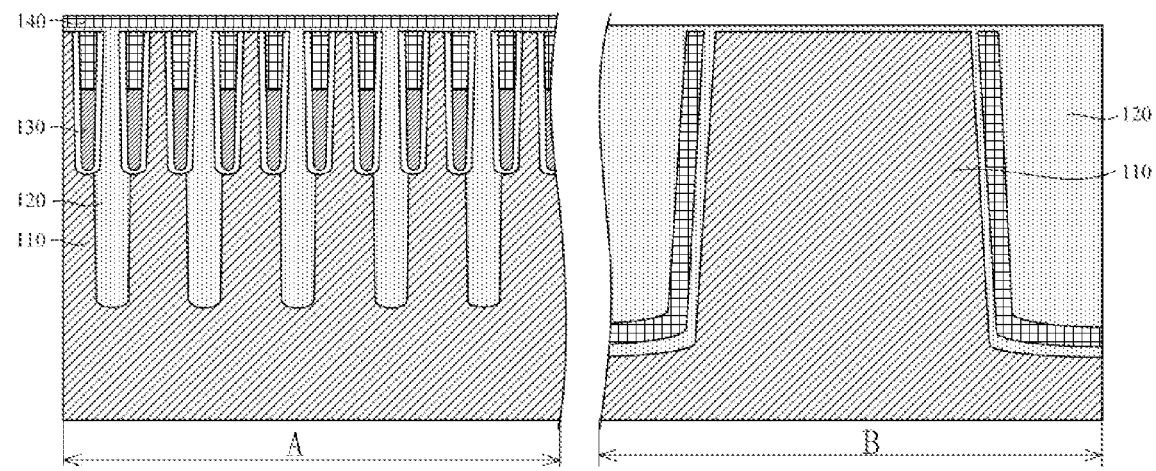
FIG. 3 is a schematic structural diagram of a substrate according to an embodiment of the present application.

Referring to FIG. 3, the substrate includes a core region and a peripheral region, a memory cell (for example, a capacitor) array is formed in the core region to store data information; and a peripheral logic circuit is formed in the peripheral region to control writing or reading of data information.

The peripheral region is provided outside the core region. For example, the peripheral region is provided at a circumferential edge of the core region, that is, the peripheral region is provided around the core region. The core region is shown by A in FIG. 3, the peripheral region is shown by B in FIG. 3, and the peripheral region and the core region may be adjacent to each other.

As shown in FIG. 3, a plurality of active regions 110 are arranged at intervals in the core region, and a shallow trench isolation (STI) structure 120 is provided between active regions 110. The shallow trench isolation structure 120 is filled with an insulating material, such as silicon oxide or silicon oxynitride, so as to isolate the active regions 110 from each other. A buried word line (BWL) 130 may be further provided in the core region.

The peripheral region may also be provided with active regions 110. As shown in FIG. 3, a spacing between the active regions 110 located in the core region is relatively small, and a spacing between the active regions 110 located in the peripheral region is relatively large. That is, the active regions 110 in the core region are denser, and the active regions 110 located in the peripheral region are sparser.

Still referring to FIG. 3, a first barrier layer 140 is further provided in the core region, and the first barrier layer 140 further insulates and protects the core region. A material of the first barrier layer 140 may be silicon nitride. For example, the first barrier layer 140 is deposited and formed in the core region. As shown in FIG. 3, the first barrier layer 140 is not provided in the peripheral region.

Step S102. Laminate and form a first conductive layer and a first mask layer on the substrate in sequence.

Figure 4:
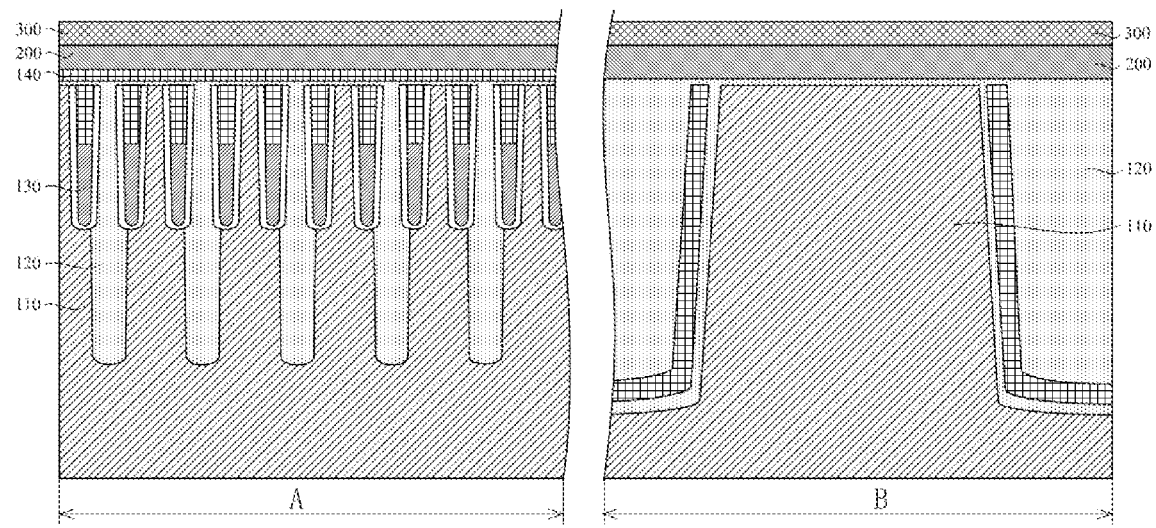
FIG. 4 is a schematic structural diagram of a core region after formation of a first mask layer according to an embodiment of the present application.

Referring to FIG. 4, a first conductive layer 200 is formed on the substrate, where the first conductive layer 200 covers the core region and the peripheral region, and then a first mask layer 300 is formed on the first conductive layer 200, where the first mask layer 300 covers the first conductive layer 200. As shown in FIG. 4, the first conductive layer 200 and the first mask layer 300 are laminated. A material of the first conductive layer 200 may be polycrystalline silicon, and a material of the first mask layer 300 may be oxide, such as silicon oxide. A thickness of the first mask layer 300 is greater than or equal to 10 nm. Compared with the related art in which the thickness of the first mask layer 300 is usually 50 nm, in this embodiment of the present application, the thickness of the first mask layer 300 may be reduced, such that the first mask layer 300 is easy to remove subsequently while protecting the first conductive layer 200.

The first conductive layer 200 and the first mask layer 300 may be formed through a deposition process. For example, the first conductive layer 200 and the first mask layer 300 are formed through chemical vapor deposition (CVD), physical vapor deposition (PVD), or atomic layer deposition (ALD).

Step S103. Etch the first mask layer, the first conductive layer, and the first barrier layer in the core region, to form a first etched hole penetrating through the first mask layer, the first conductive layer, and the first barrier layer, where the first etched hole is opposite to the active region.

Figure 5:
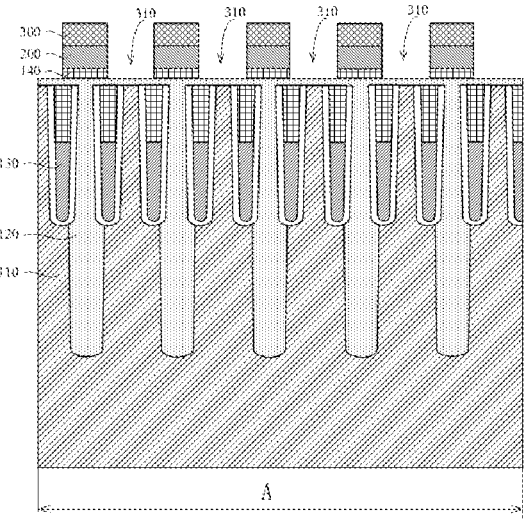
FIG. 5 is a schematic structural diagram of a core region after formation of a first etched hole according to an embodiment of the present application.

Referring to FIG. 5, part of the first mask layer 300, part of the first conductive layer 200, and part of the first barrier layer 140 in the core region are removed, to form a first etched hole 310, where the first etched hole 310 runs through the first mask layer 300, the first conductive layer 200, and the first barrier layer 140.

As shown in FIG. 5, the first etched hole 310 is opposite to the active region 110. For example, an orthographic projection of the first etched hole 310 on the active region 110 covers part of a surface of the active region 110, for example, covers a central region of an upper surface of the active region 110.

Step S104. Etch the substrate along the first etched hole, to form a bit line contact hole, where the bit line contact hole exposes the active region.

Figure 6:
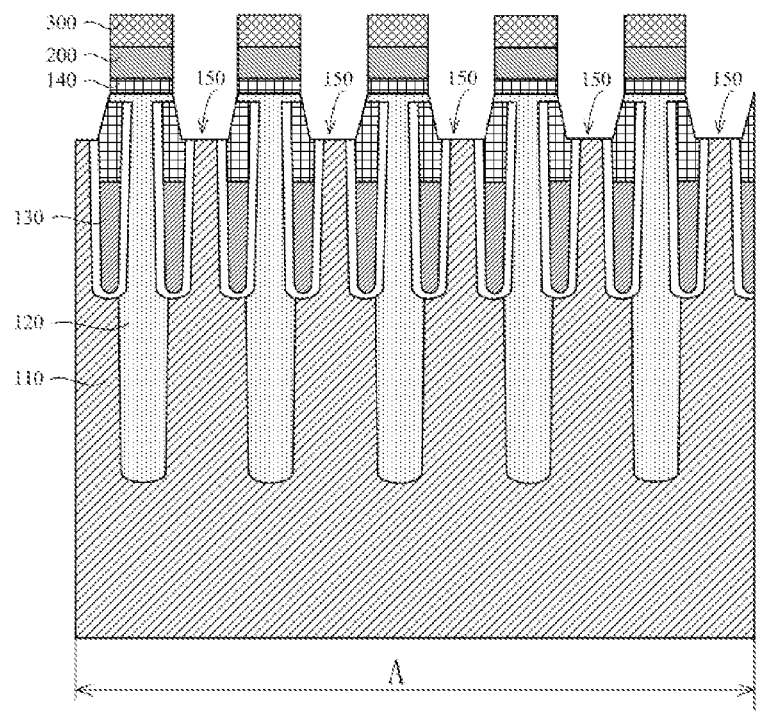
FIG. 6 is a schematic structural diagram of a core region after formation of a bit line contact hole according to an embodiment of the present application.

Referring to FIG. 6, the substrate is etched along the first etched hole 310, to form a bit line contact hole 150 in the core region. The bit line contact hole 150 exposes the active region 110, that is, at least part of a hole bottom of the bit line contact hole 150 is the active region 110.

Step S105. Remove the first mask layer and the first conductive layer in the core region and located around the bit line contact hole, and retain the first barrier layer located around the bit line contact hole.

Figure 7:
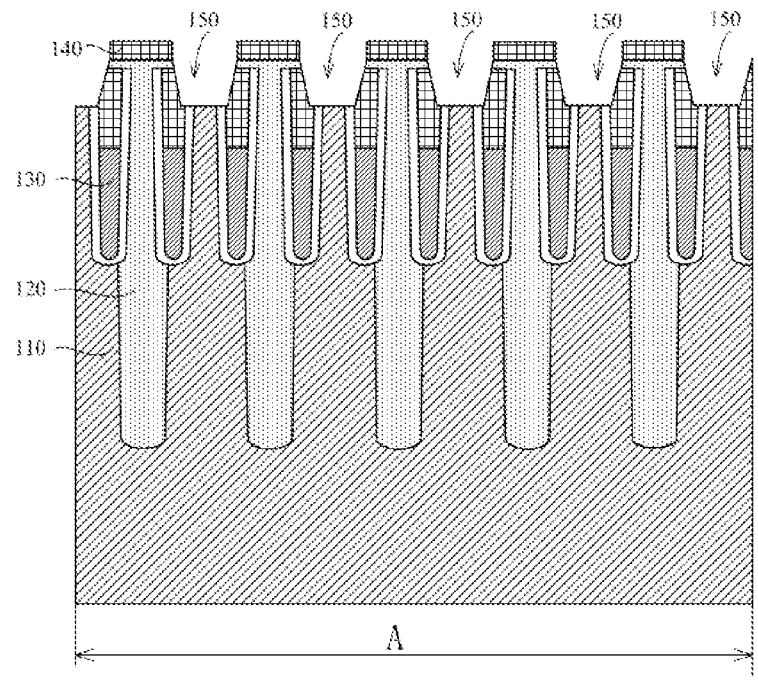
FIG. 7 is a schematic structural diagram of a core region after removal of part of a first conductive layer and part of a first mask layer according to an embodiment of the present application.

Referring to FIG. 7, the first mask layer 300 and the first conductive layer 200 in the core region are removed, and the first barrier layer 140 in the core region is retained. As shown in FIG. 7, the first barrier layer 140 is exposed in the core region, and after the first mask layer 300 and the first conductive layer 200 in the core region are removed, a thickness of a film layer on the substrate is reduced, that is, a depth of the first etched hole 310 is reduced, such that a total depth of the first etched hole 310 and the bit line contact hole 150 is reduced, thereby facilitating subsequent formation of a better-quality bit line contact 410.

Step S106. Form a bit line contact in the bit line contact hole, where the bit line contact is electrically connected to the active region, and a surface of the bit line contact away from the substrate is flush with a surface of the first barrier layer away from the substrate.

Figure 8:
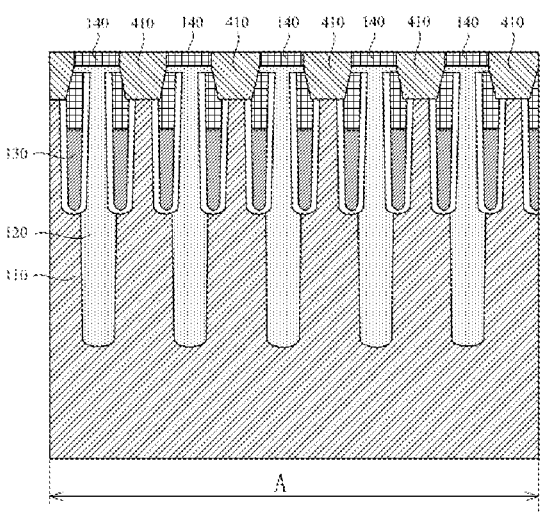
FIG. 8 is a schematic structural diagram of a core region after formation of a bit line contact according to an embodiment of the present application.

Referring to FIG. 8, a bit line contact 410 is formed in the bit line contact hole 150, and the bit line contact 410 is in contact with the active region 110, such that the bit line contact 410 is electrically connected to the active region 110. The surface of the bit line contact 410 away from the substrate is flush with a surface of the first barrier layer 140 away from the substrate. As shown in FIG. 8, an upper surface of the bit line contact 410 is flush with an upper surface of the first barrier layer 140, such that other relatively flat film layers are formed on the bit line contact 410 and on the first barrier layer 140.

Before the formation of the bit line contact 410, the first mask layer 300 and the first conductive layer 200 located around the bit line contact hole 150 in the core region are removed, such that a formation height of the bit line contact 410 is reduced and formation quality of the bit line contact 410 is good, thereby reducing generation of a void and/or a seam due to uneven filling of the bit line contact 410, improving a capability of the bit line contact 410 to transmit a charge, and improving performance of the memory.

Figure 9:
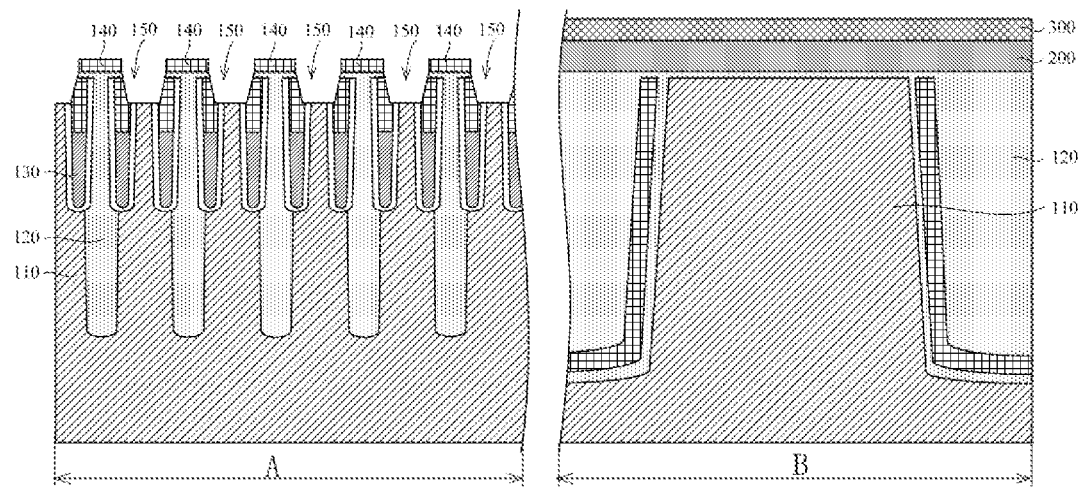
FIG. 9 is a schematic structural diagram after removal of part of a first conductive layer and part of a first mask layer according to an embodiment of the present application.
Figure 10:
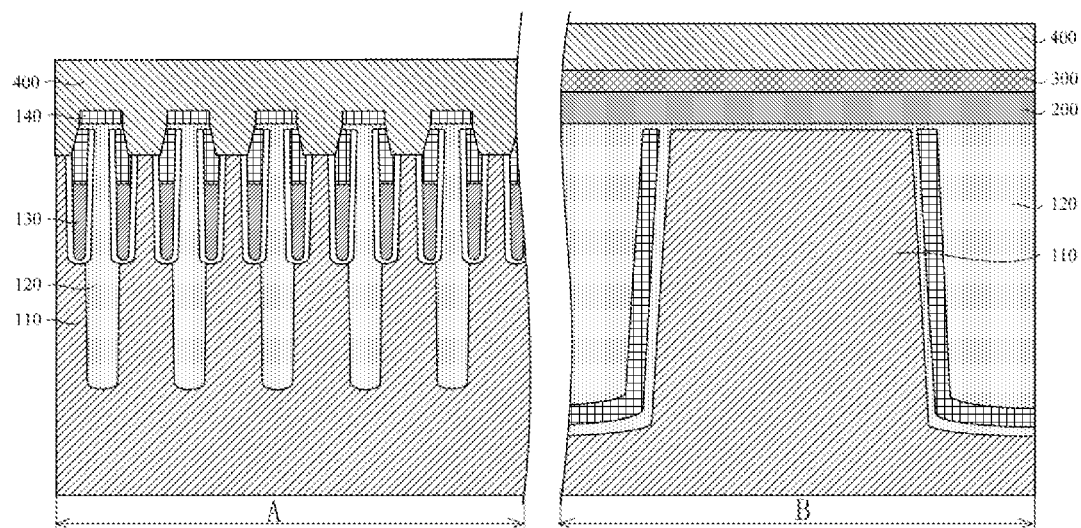
FIG. 10 is a schematic structural diagram after formation of a second conductive layer according to an embodiment of the present application.
Figure 11:
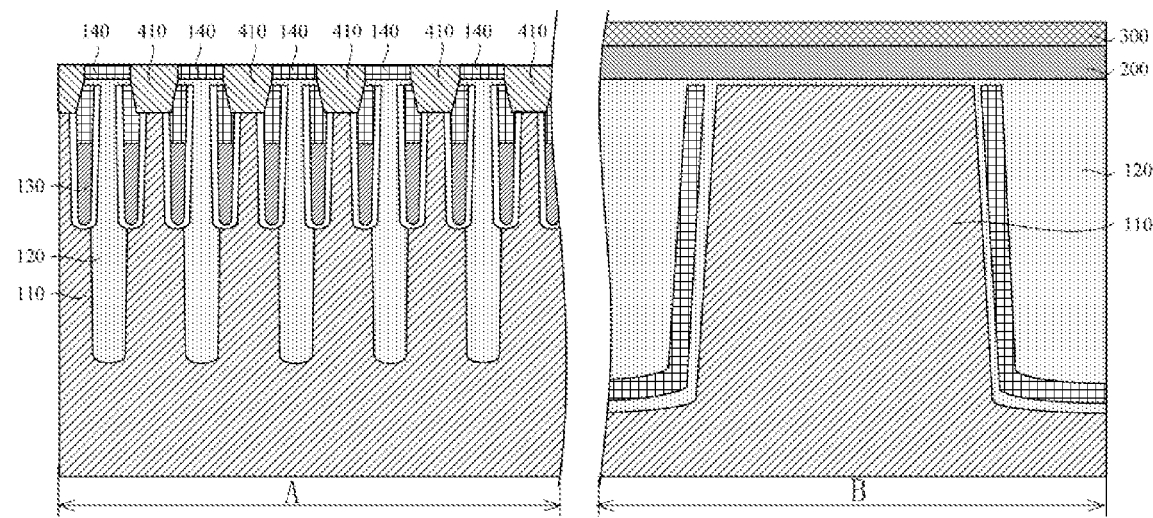
FIG. 11 is a schematic structural diagram after removal of part of a second conductive layer according to an embodiment of the present application.

In a possible embodiment, referring to FIG. 9 to FIG. 11, the step of forming a bit line contact 410 in the bit line contact hole 150 includes:

referring to FIG. 9 and FIG. 10, depositing a second conductive layer 400 in the bit line contact hole 150, on the first barrier layer 140 in the core region, and on the first mask layer 300 in the peripheral region. As shown in FIG. 9 and FIG. 10, the second conductive layer 400 fills the bit line contact hole 150, and covers the first barrier layer 140 in the core region and the first mask layer 300 in the peripheral region.

It can be understood that, the second conductive layer 400 also fills the remaining first etched hole 310, that is, the second conductive layer 400 fills the first etched hole 310 between the first barrier layers 140. A material of the second conductive layer 400 may be polycrystalline silicon, such as doped polysilicon or non-doped polysilicon. Certainly, the material of the second conductive layer 400 is not limited. For example, the material of the second conductive layer 400 may alternatively be a metal conductive material.

Referring to FIG. 11, after the deposition of the second conductive layer 400, the second conductive layer 400 on the first barrier layer 140 in the core region and the second conductive layer 400 in the peripheral region are etched and removed. For example, the first barrier layer 140 in the core region is used as an etching stop layer, part of the second conductive layer 400 is etched and removed, and the second conductive layer 400 located in the bit line contact hole 150 is retained, and the retained second conductive layer 400 is flush with the first barrier layer 140.

The second conductive layer 400 is etched back after the deposition of the second conductive layer 400, to form the bit line contact 410. As shown in FIG. 11, the first barrier layer 140 is exposed in the core region, and the first conductive layer 200 is exposed in the peripheral region.

During the deposition of the second conductive layer 400, a thickness of a film layer on the substrate is reduced, and a depth of a hole to be filled by the second conductive layer 400 is reduced, such that deposition difficulty of the second conductive layer 400 in the bit line contact hole 150 is reduced, and deposition quality is good, thereby reducing or even avoiding formation of a void or a seam in the second conductive layer 400 in the bit line contact hole 150, that is, reducing or even avoiding occurrence of a void or a seam in the bit line contact 410, and improving formation quality of the bit line contact 410.

Figure 12:
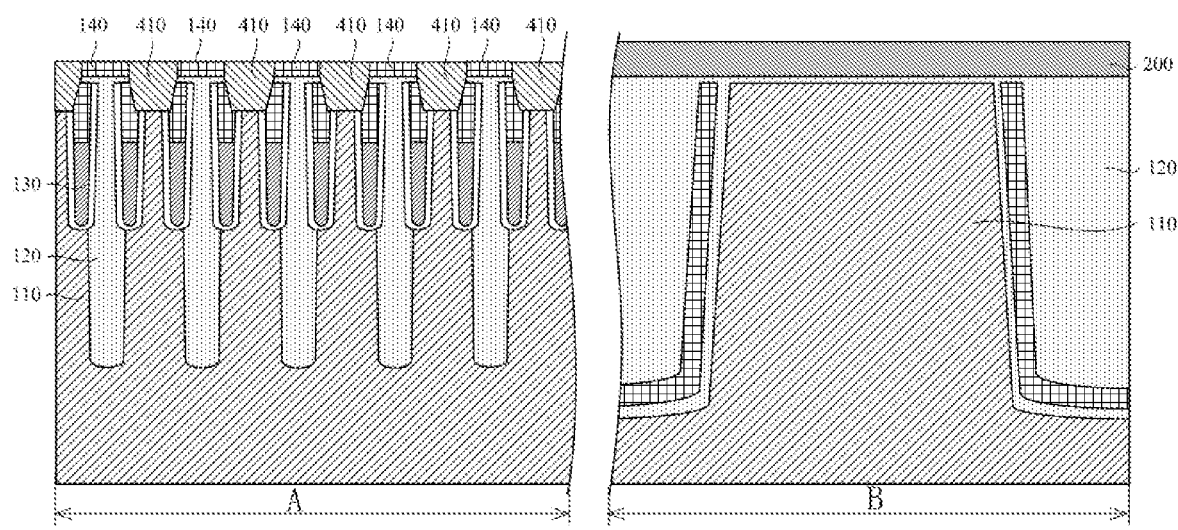
FIG. 12 is a schematic structural diagram after removal of the remaining first mask layer according to an embodiment of the present application.

Referring to FIG. 12, after the second conductive layer 400 on the first barrier layer 140 in the core region and the second conductive layer 400 in the peripheral region are etched and removed, the first mask layer 300 in the peripheral region is etched and removed, to expose the first conductive layer 200 in the peripheral region. For example, the first mask layer 300 in the peripheral region is removed through wet etching. As shown in FIG. 12, the bit line contact 410 is formed in the core region, and the first conductive layer 200 is exposed in the peripheral region.

The manufacturing method of a memory in this embodiment of the present application includes: providing a substrate, where the substrate includes a core region and a peripheral region located outside the core region, a plurality of active regions 110 are arranged at intervals in the core region, and a first barrier layer 140 is further provided in the core region; laminating and forming a first conductive layer 200 and a first mask layer 300 on the substrate in sequence; etching the first mask layer 300, the first conductive layer 200, and the first barrier layer 140 in the core region, to form a first etched hole 310, where the first etched hole 310 is opposite to the active region 110; etching the substrate along the first etched hole 310, to form a bit line contact hole 150, where the bit line contact hole 150 exposes the active region 110; removing the first mask layer 300 and the first conductive layer 200 in the core region and located around the bit line contact hole 150, and retaining the first barrier layer 140 located around the bit line contact hole 150; and forming a bit line contact 410 in the bit line contact hole 150, where the bit line contact 410 is electrically connected to the active region 110, and a surface of the bit line contact 410 away from the substrate is flush with a surface of the first barrier layer 140 away from the substrate. The removal of the first mask layer 300 and the first conductive layer 200 around the bit line contact hole 150 in the core region reduces a total depth of the first etched hole 310 and the bit line contact hole 150, such that during subsequent formation of the bit line contact 410, the surface of the bit line contact 410 away from the substrate is flush with the surface of the first barrier layer 140 away from the substrate. Compared with the related art in which the bit line contact 410 is flush with the first conductive layer 200, in the manufacturing method of a memory in this embodiment of the present application, a formation height of the bit line contact 410 is reduced, thereby reducing or even avoiding formation of a void or a seam in the bit line contact 410, that is, improving formation quality of the bit line contact 410, improving a capability of the bit line contact 410 to transmit a charge, and improving performance of the memory.

Figure 13:
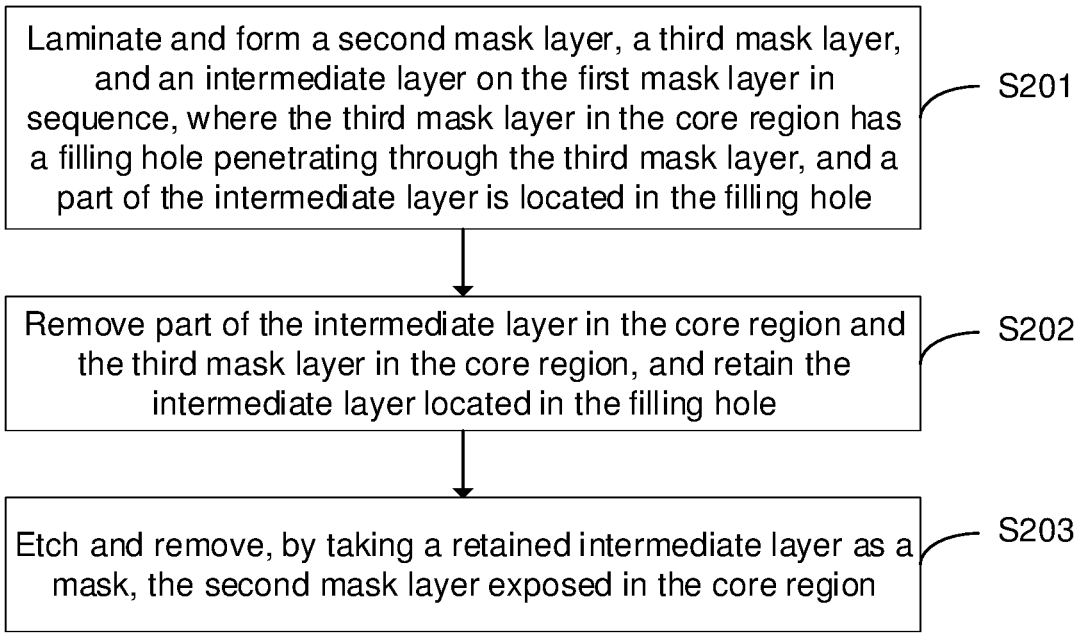
FIG. 13 is a flowchart of after formation of a first mask layer according to an embodiment of the present application.

Referring to FIG. 13, in some possible embodiments, after the step of laminating and forming a first conductive layer 200 and a first mask layer 300 on the substrate in sequence, the manufacturing method of a memory further includes:

Step S201. Laminate and form a second mask layer, a third mask layer, and an intermediate layer on the first mask layer in sequence, where the third mask layer in the core region has a filling hole penetrating through the third mask layer, and part of the intermediate layer is located in the filling hole.

Figure 14:
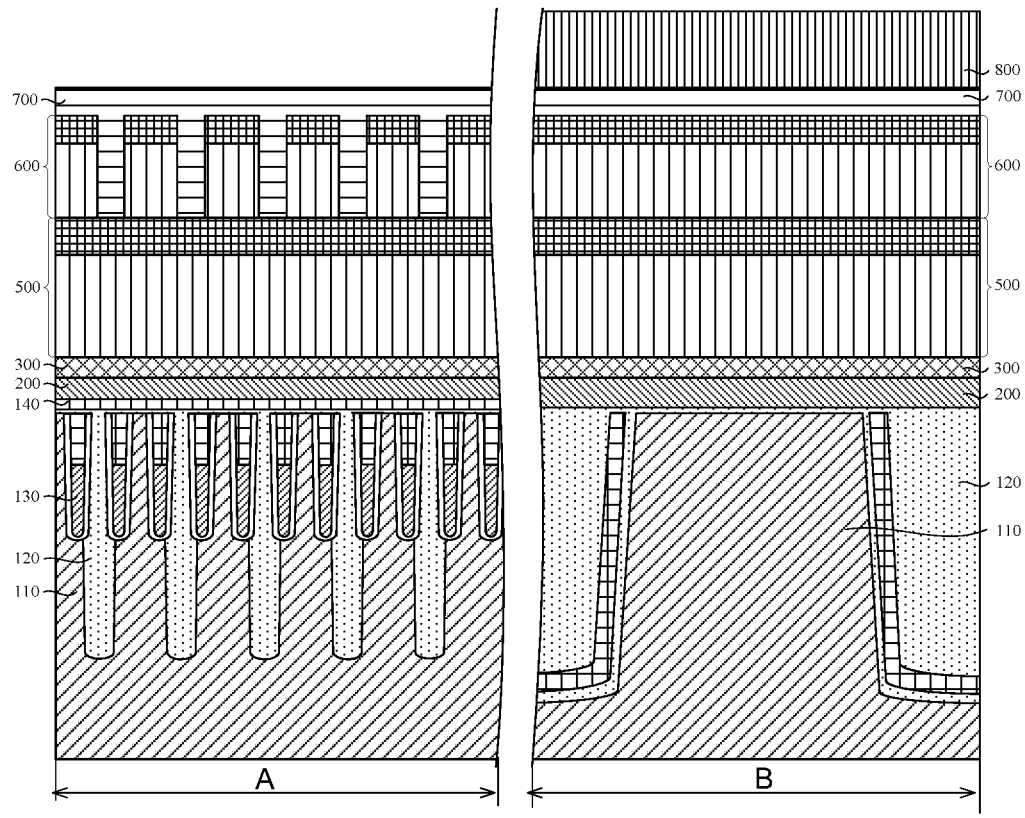
FIG. 14 is a schematic structural diagram after formation of a first photoresist layer according to an embodiment of the present application.

Referring to FIG. 14, a second mask layer 500 is formed on the first mask layer 300, a third mask layer 600 is formed on the second mask layer 500, and an intermediate layer 700 is formed on the third mask layer 600. As shown in FIG. 14, the first mask layer 300, the second mask layer 500, the third mask layer 600, and the intermediate layer 700 form a stacked structure, and all the four film layers are located on the core region and the peripheral region.

As shown in FIG. 14, the third mask layer 600 in the core region has a filling hole, and the filling hole runs through the third mask layer 600, that is, a hole bottom of the filling hole is the second mask layer 500. The filling hole is opposite to the active region 110. For example, an orthographic projection of the filling hole on the active region 110 covers part of a surface of the active region 110 facing away from the substrate.

Part of the intermediate layer 700 is located in the filling hole, and part of the intermediate layer 700 is located on the third mask layer 600, that is, part of the intermediate layer 700 is located in the third mask layer 600, and part of the intermediate layer 700 is located outside the third mask layer 600. The intermediate layer 700 located in the filling hole is subsequently used as a mask for the bit line contact hole 150. A material of the intermediate layer 700 may be oxide.

For example, the step of laminating and forming a second mask layer 500, a third mask layer 600, and an intermediate layer 700 on the first mask layer 300 in sequence may include: depositing the second mask layer 500 and the third mask layer 600 on the first mask layer 300 in sequence, that is, depositing the second mask layer 500 on the first mask layer 300, and depositing the third mask layer 600 on the second mask layer 500; etching and removing part of the third mask layer 600 in the core region, to form the filling hole; and depositing the intermediate layer 700 in the filling hole and on the third mask layer 600.

It should be noted that, a deposition thickness of the intermediate layer 700 is greater than a thickness of the third mask layer 600 and may be less than a preset value, that is, a total height of the intermediate layer 700 along a direction facing away from the substrate is less than a preset value, and the intermediate layer 700 may be removed at the same time with etching of a film layer below the intermediate layer 700 when the intermediate layer 700 is used as a mask.

Step S202. Remove part of the intermediate layer in the core region and the third mask layer in the core region, and retain the intermediate layer located in the filling hole.

Figure 15:
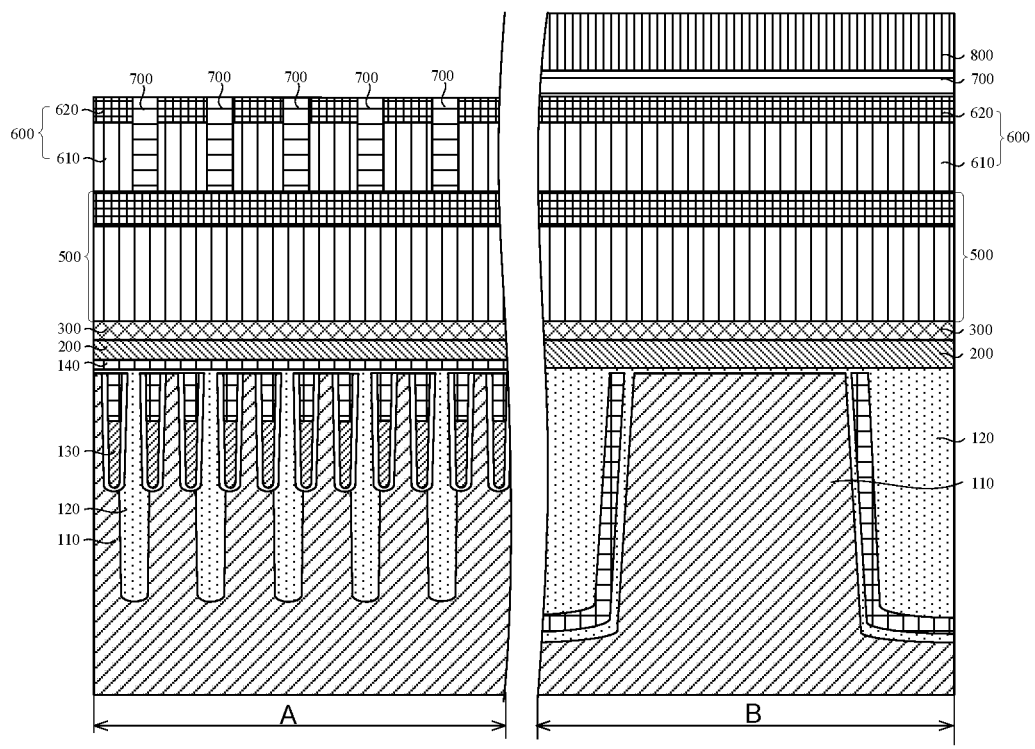
FIG. 15 is a schematic structural diagram after removal of part of an intermediate layer in a core region according to an embodiment of the present application.
Figure 16:
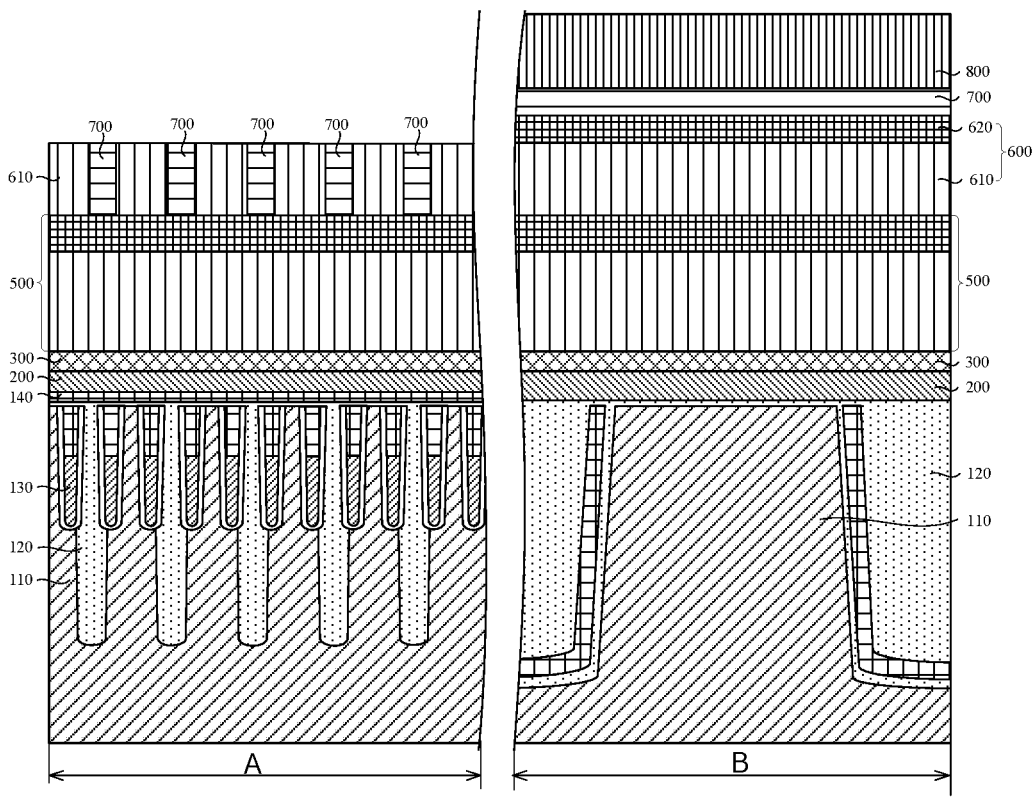
FIG. 16 is a schematic structural diagram after etching of a first anti-reflection layer in a core region according to an embodiment of the present application.
Figure 17:
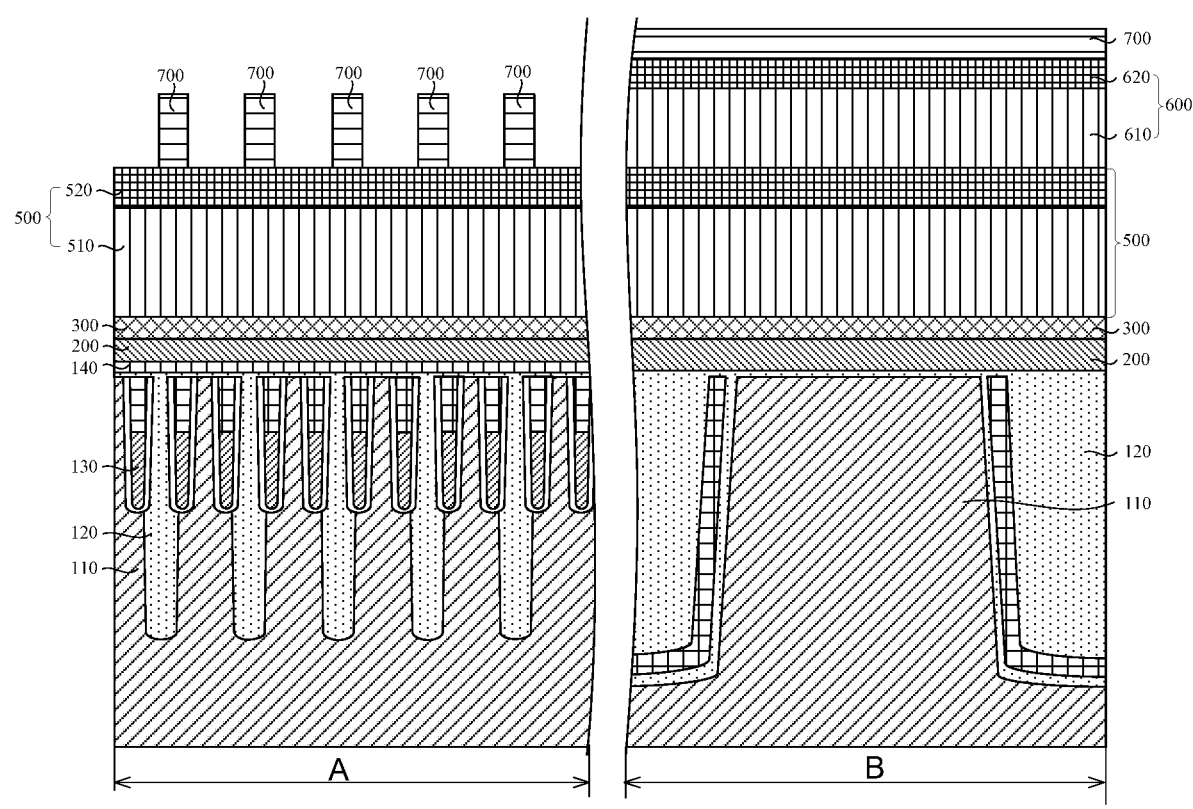
FIG. 17 is a schematic structural diagram after etching of a first base layer in a core region according to an embodiment of the present application.

Referring to FIG. 14 to FIG. 17, the intermediate layer 700 located in the filling hole is retained, the remaining intermediate layer 700 in the core region is etched and removed, and the third mask layer 600 in the core region is etched and removed. As shown in FIG. 17, the second mask layer 500 is exposed between intermediate layers 700 retained in the core region, and the intermediate layer 700 is exposed in the peripheral region.

In some possible embodiments, the removing the third mask layer 600 in the core region and part of the intermediate layer 700 in the core region, and retaining the intermediate layer 700 located in the filling hole may include:

referring to FIG. 14, depositing a photoresist layer 800 on the intermediate layer 700 in the peripheral region, where the photoresist layer 800 covers the intermediate layer 700.

As shown in FIG. 14, the photoresist layer 800 covers the intermediate layer 700 in the peripheral region, and the photoresist layer 800 does not cover the intermediate layer 700 in the core region, that is, the intermediate layer 700 in the core region is exposed.

Referring to FIG. 15, after the deposition of the photoresist layer 800, the intermediate layer 700 on the third mask layer 600 in the core region is etched and removed by taking the photoresist layer 800 as a mask. As shown in FIG. 15, the third mask layer 600 is used as an etching stop layer, the intermediate layer 700 is etched, the intermediate layer 700 covered by the photoresist layer 800 is retained, and the intermediate layer 700 not covered by the photoresist layer 800 and located on the third mask layer 600 is removed.

Referring to FIG. 16 and FIG. 17, after the intermediate layer 700 on the third mask layer 600 in the core region is etched and removed, the third mask layer 600 in the core region and the photoresist layer 800 in the peripheral region are etched and removed, the second mask layer 500 is exposed in the core region, and the intermediate layer 700 is exposed in the peripheral region.

For example, as shown in FIG. 15, the third mask layer 600 includes a first base layer 610 located on the second mask layer 500, and a first anti-reflection layer 620 located on the first base layer 610. A material of the first anti-reflection layer 620 may be silicon oxynitride. A material of the first base layer 610 may be spin-on carbon (SOC). The step of etching and removing the third mask layer 600 in the core region and the photoresist layer 800 in the peripheral region, to expose the second mask layer 500 in the core region and the intermediate layer 700 in the peripheral region includes:

etching and removing the first anti-reflection layer 620 in the core region, to expose the first base layer 610 in the core region. As shown in FIG. 16, the first base layer 610 is used as an etching stop layer, the first anti-reflection layer 620 is etched, to remove the first anti-reflection layer 620 in the core region, and none of the intermediate layer 700 in the peripheral region and the first anti-reflection layer 620 are etched. During the etching and removal of the first anti-reflection layer 620 in the core region, the intermediate layer 700 on the first base layer 610 in the core region is also removed, that is, the first base layer 610 in the core region is flush with the intermediate layer 700 in the core region.

The first base layer 610 in the core region and the photoresist layer 800 in the peripheral region are etched and removed at the same time. As shown in FIG. 17, the first base layer 610 in the core region and the photoresist layer 800 in the peripheral region are removed in a same etching process.

For example, an etch selectivity ratio of the first base layer 610 to the intermediate layer 700 is greater than or equal to 50, a first etchant is oxygen ($O_2$), a first etching frequency is 60 MHz, and a first etching power is 1000 W to 1200 W. With such settings, the photoresist layer 800 in the peripheral region is further etched and removed while the first base layer 610 is etched and removed, and the intermediate layer 700 in the core region and the intermediate layer 700 in the peripheral region are not removed.

Referring to FIG. 17, the intermediate layer 700 is retained in the core region, and the intermediate layer 700 is retained in the peripheral region, such that in a subsequent etching process, the intermediate layer 700 in the core region and the intermediate layer 700 in the peripheral region can be removed at the same time. In addition, film layers in the core region and in the peripheral region have a good correspondence, such that the core region and the peripheral region can be etched at the same time, thereby improving manufacturing efficiency of the memory. For example, the second mask layer 500 in the core region and the third mask layer 600 in the peripheral region can be processed at the same time.

Step S203. Etch and remove, by taking the retained intermediate layer as a mask, the second mask layer exposed in the core region.

A pattern of the intermediate layer 700 in the core region is transferred to the second mask layer 500, and the etched second mask layer 500 can continue to transfer the pattern to the first mask layer 300, the first conductive layer 200, and the first barrier layer 140, to facilitate subsequent formation of the first etched hole 310 in the first mask layer 300, the first conductive layer 200, and the first barrier layer 140.

In the foregoing step, an etch selectivity ratio of the second mask layer 500 to the intermediate layer 700 is adjusted, such that the intermediate layer 700 in the peripheral region is removed while the second mask layer 500 exposed in the core region is removed. It can be understood that, the intermediate layer 700 in the core region is also partially removed.

In some possible embodiments, referring to FIG. 18 to FIG. 21, the second mask layer 500 includes a second base layer 510 located on the first mask layer 300, and a second anti-reflection layer 520 located on the second base layer 510.

Figure 18:
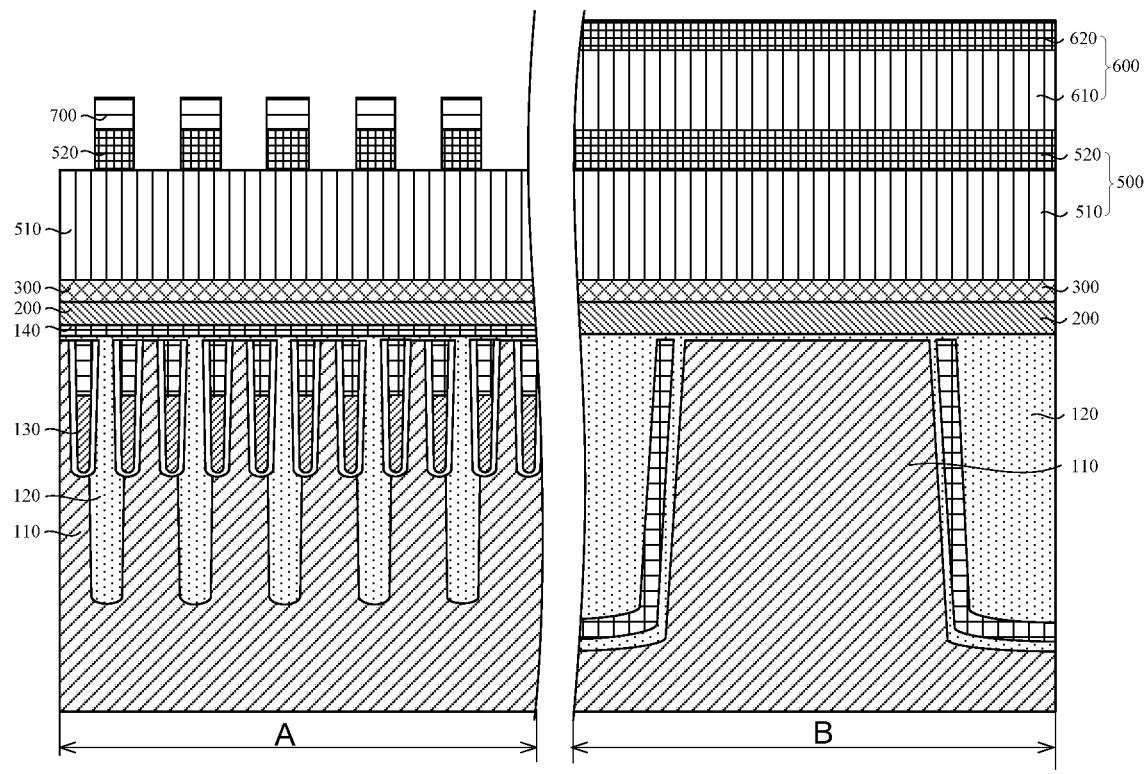
FIG. 18 is a schematic structural diagram after etching of a second anti-reflection layer in a core region according to an embodiment of the present application.

For example, a material of the second base layer 510 is SOC, and a material of the second anti-reflection layer 520 is silicon oxynitride. Correspondingly, the etching and removing, by taking the retained intermediate layer 700 as a mask, the second mask layer 500 exposed in the core region may specifically include:

referring to FIG. 18, etching and removing the second anti-reflection layer 520 exposed in the core region, and etching and removing part of the intermediate layer 700 in the core region and the entire intermediate layer 700 in the peripheral region. As shown in FIG. 18, the second base layer 510 is exposed in the core region, and the third mask layer 600 is exposed in the peripheral region.

An etch selectivity ratio of the intermediate layer 700 to the second anti-reflection layer 520 is 1, and a thickness of the intermediate layer 700 in the peripheral region is greater than a thickness of the second anti-reflection layer 520 and less than 1.2 to 1.3 times a thickness of the second anti-reflection layer 520, that is, a thickness of the part of the intermediate layer 700 located on the third mask layer 600 is greater than a thickness of the second anti-reflection layer 520 and less than 1.2 to 1.3 times a thickness of the second anti-reflection layer 520, such that the intermediate layer 700 is etched while the second anti-reflection layer 520 is etched.

During the etching, a second etchant includes sulfur hexafluoride ($SF_6$) and difluoromethane ($CH_2F_2$), and a diluent is nitrogen ($N_2$) or helium (He). Certainly, the second etchant is not limited, and the second etchant may alternatively be other organic compounds or mixtures containing fluorocarbons.

Figure 19:
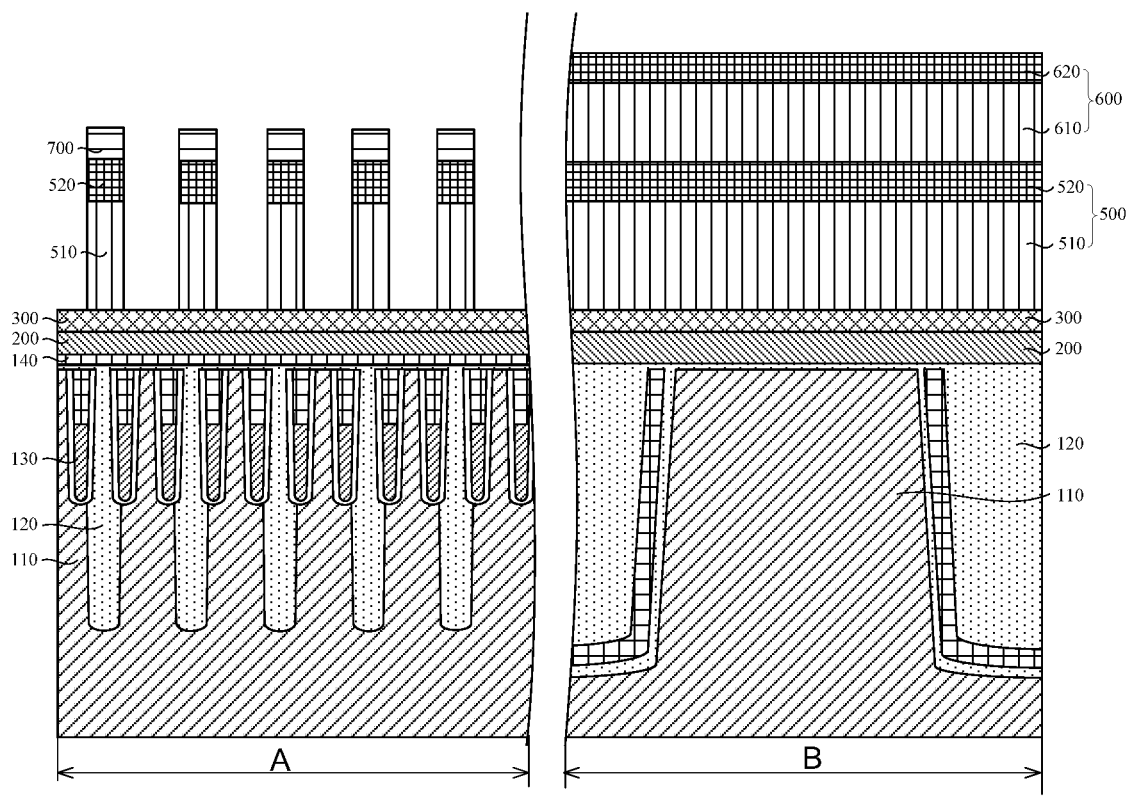
FIG. 19 is a schematic structural diagram after etching of a second base layer in a core region according to an embodiment of the present application.

Referring to FIG. 19, the second base layer 510 is etched by taking the remaining intermediate layer 700 as a mask, to remove the exposed second base layer 510. As shown in FIG. 19, the first mask layer 300 is exposed in the core region, and the third mask layer 600 is exposed in the peripheral region.

For example, as shown in FIG. 19, the third mask layer 600 includes a first base layer 610 and a first anti-reflection layer 620, where the first base layer 610 is located on the second mask layer 500, and the first anti-reflection layer 620 is located on the first base layer 610. This embodiment and the following embodiments are described in detail by using an example in which the second mask layer 500 includes a second base layer 510 and a second anti-reflection layer 520, and the third mask layer 600 includes a first base layer 610 and a first anti-reflection layer 620.

A thickness of the second base layer 510 is greater than or equal to 1.3 to 1.5 times a thickness of the first base layer 610. An etch selectivity ratio of the second base layer 510 to the first anti-reflection layer 620 is greater than or equal to 20. A fourth etchant may be a mixture of sulfur dioxide ($SO_2$) and oxygen, to etch the second base layer 510 while retaining at least part of the first anti-reflection layer 620 in the peripheral region.

It can be understood that, the entire intermediate layer 700 can be removed while the second anti-reflection layer 520 exposed in the core region is etched and removed, that is, the entire intermediate layer 700 in the core region and the entire intermediate layer 700 in the peripheral region are etched and removed. Correspondingly, a film layer below the intermediate layer 700 in the core region is used as a mask to transfer a pattern during subsequent etching. For example, the second anti-reflection layer 520 is used as a mask during the etching of the second base layer 510.

Figure 20:
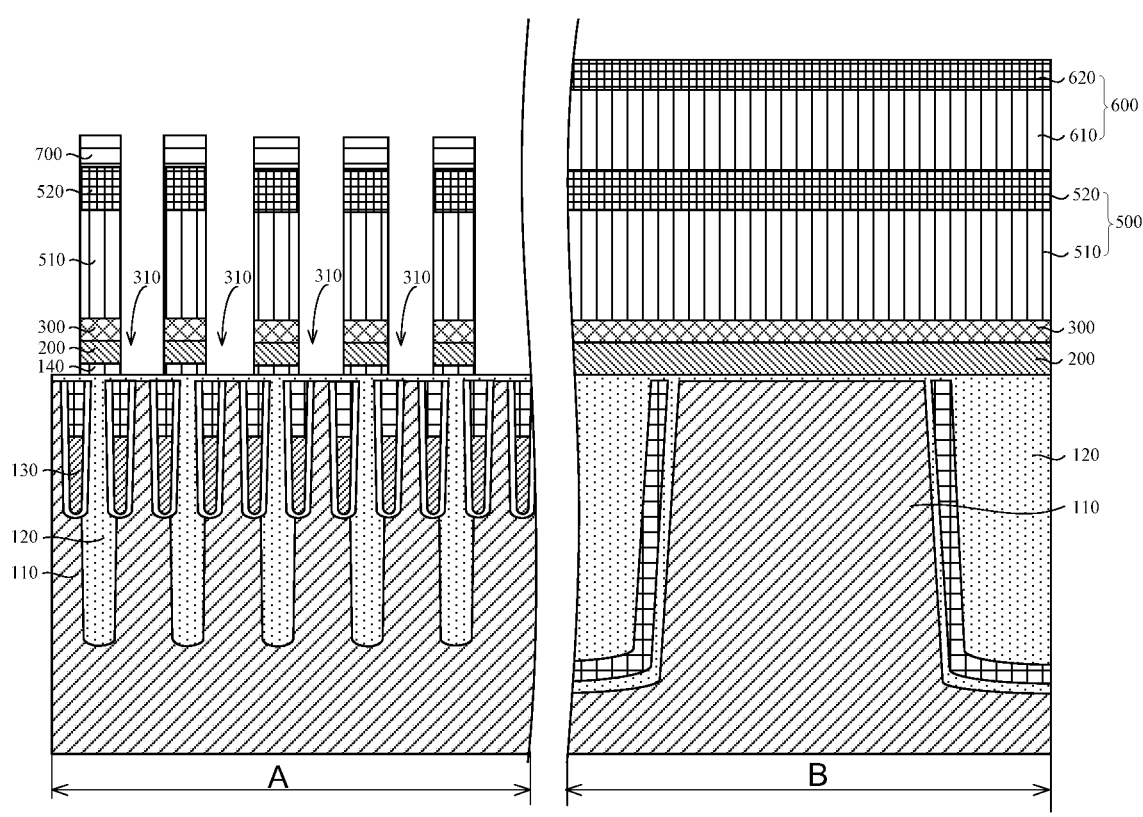
FIG. 20 is a schematic structural diagram after formation of a first etched hole according to an embodiment of the present application.

It should be noted that, referring to FIG. 19 and FIG. 20, the step of removing the first mask layer 300 and the first conductive layer 200 in the core region and located around the bit line contact hole 150, and retaining the first barrier layer 140 located around the bit line contact hole 150 includes: etching the first mask layer 300, the first conductive layer 200, and the first barrier layer 140 by taking the remaining intermediate layer 700 as a mask, to form the first etched hole 310.

As shown in FIG. 19 and FIG. 20, after the second base layer 510 is etched by taking the remaining intermediate layer 700 a mask, to remove the exposed second base layer 510, the remaining intermediate layer 700 is used as a mask to continue to etch the first mask layer 300, the first conductive layer 200, and the first barrier layer 140, to form the first etched hole 310 in the core region.

Figure 21:
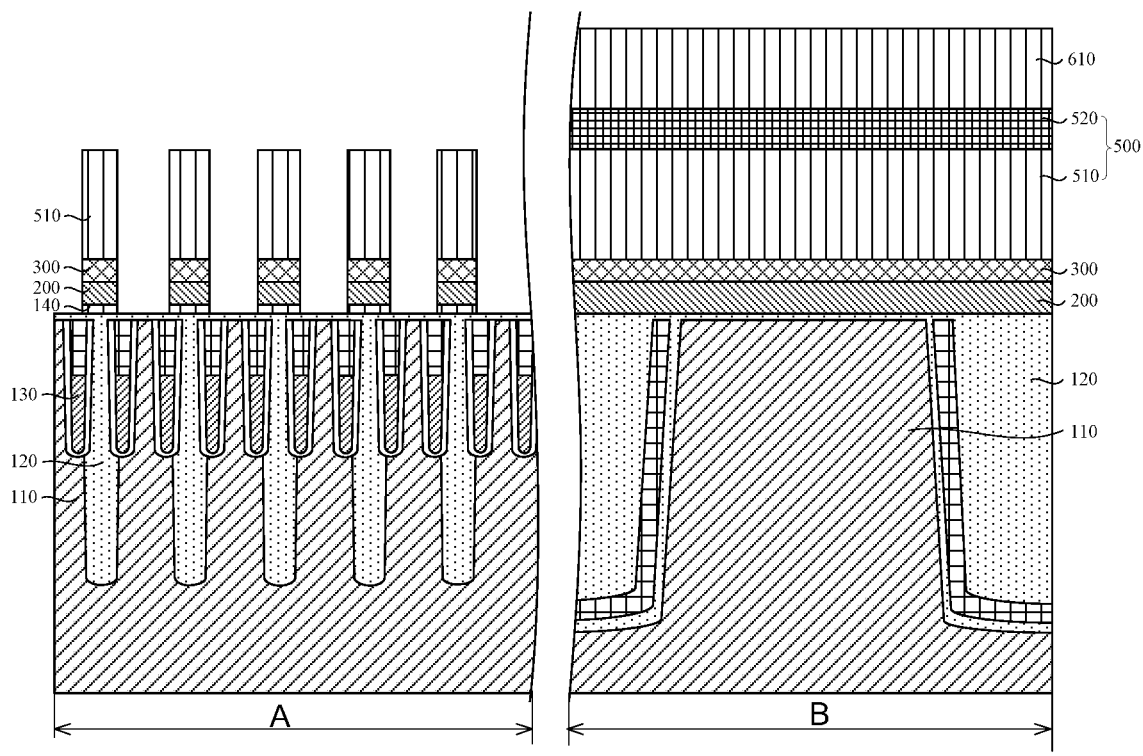
FIG. 21 is a schematic structural diagram after removal of the remaining intermediate layer in a core region according to an embodiment of the present application.
Figure 22:
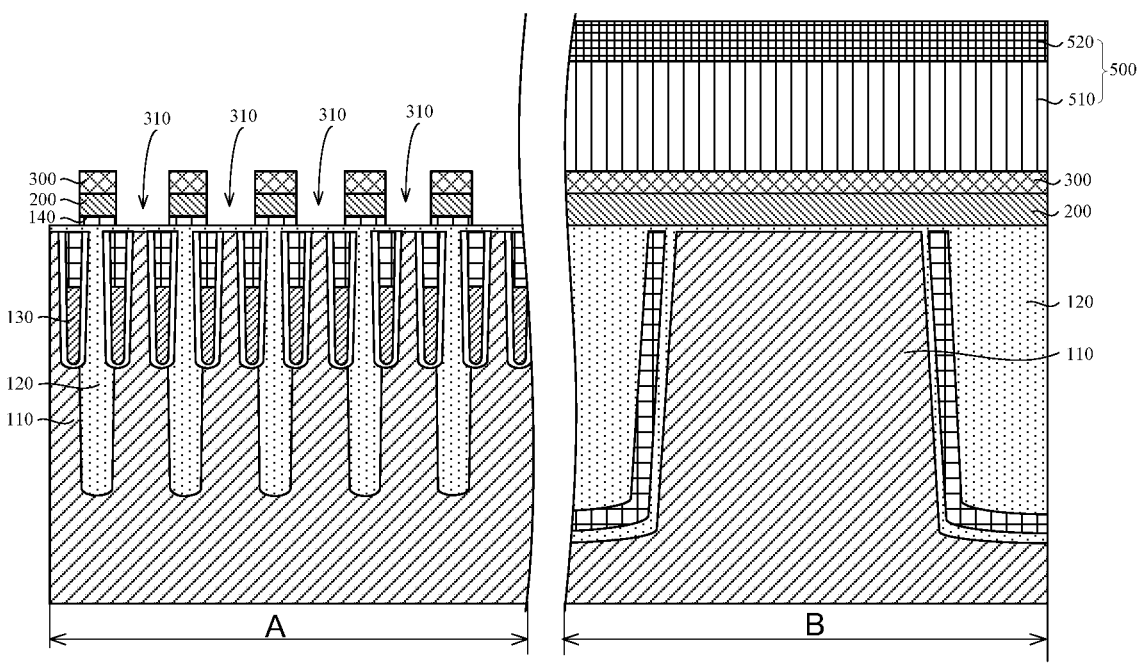
FIG. 22 is a schematic structural diagram after removal of the remaining second base layer in a core region according to an embodiment of the present application.
Figure 23:
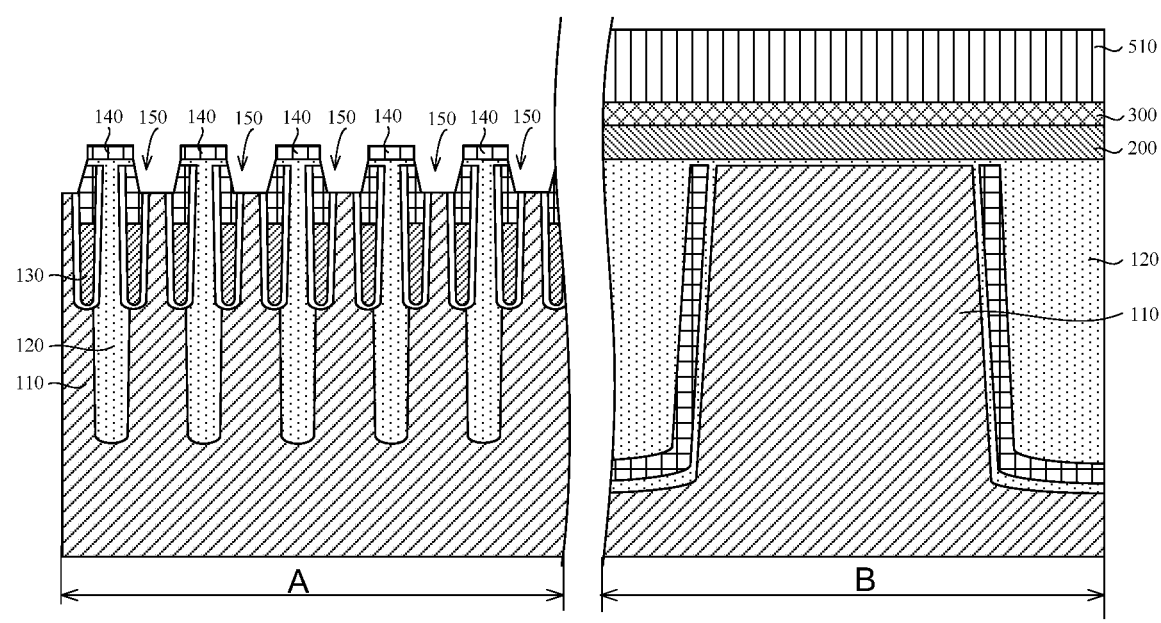
FIG. 23 is a schematic structural diagram after removal of a second anti-reflection layer in a peripheral region according to an embodiment of the present application.

It should be noted that, referring to FIG. 21 to FIG. 23, after the step of etching the second base layer 510 by taking the remaining intermediate layer 700 as a mask, to remove the exposed second base layer 510, the manufacturing method of a memory further includes:

referring to FIG. 21, removing the remaining intermediate layer 700, the remaining second anti-reflection layer 520 in the core region, and the first anti-reflection layer 620 in the peripheral region. As shown in FIG. 21, the second base layer 510 is exposed in the core region, and the first base layer 610 is exposed in the peripheral region, such that the first base layer 610 and the second base layer 510 can be subsequently removed at the same time.

Referring to FIG. 22, the remaining second base layer 510 in the core region and the first base layer 610 in the peripheral region are removed at the same time. For example, an etch selectivity ratio of the first base layer 610 to the first mask layer 300 is greater than or equal to 50, and an etch selectivity ratio of the first base layer 610 to the second anti-reflection layer 520 is greater than or equal to 50. A third etchant is oxygen, a second etching frequency is 60 MHz, and a second etching power is 1000 W to 1200 W. As shown in FIG. 22, the first mask layer 300 is exposed in the core region, and the second anti-reflection layer 520 is exposed in the peripheral region.

It should be noted that, referring to FIG. 23, the step of removing the first mask layer 300 and the first conductive layer 200 in the core region and located around the bit line contact hole 150, and retaining the first barrier layer 140 located around the bit line contact hole 150 further includes: removing the remaining first mask layer 300 and the remaining first conductive layer 200 in the core region, and removing the second anti-reflection layer 520 in the peripheral region; and removing the second base layer 510 in the peripheral region, to expose the first mask layer 300 in the peripheral region.

As shown in FIG. 23, both the remaining first mask layer 300 in the core region and the remaining first conductive layer 200 in the core region are removed, and the first barrier layer 140 is exposed in the core region. The second anti-reflection layer 520 in the peripheral region is also removed, and the second base layer 510 is exposed in the peripheral region.

The first mask layer 300 in the core region, the first conductive layer 200 in the core region, and the second anti-reflection layer 520 in the peripheral region may be removed in this step. For example, the first mask layer 300 in the core region, the first conductive layer 200 in the core region, and the second anti-reflection layer 520 in the peripheral region are etched and removed while the substrate is etched along the first etched hole 310 to form the bit line contact hole 150. Subsequently, the second base layer 510 in the peripheral region is removed through wet etching.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure. In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present application.

The invention claimed is:

1. A manufacturing method of a memory, comprising:
   providing a substrate; wherein the substrate comprises a core region and a peripheral region located outside the core region, a plurality of active regions are arranged at intervals in the core region, and a first barrier layer is further provided in the core region;
   forming a first conductive layer and a first mask layer on the substrate in sequence;
   etching the first mask layer, the first conductive layer, and the first barrier layer which are in the core region, to form a first etched hole penetrating through the first mask layer, the first conductive layer, and the first barrier layer; wherein the first etched hole is opposite to the active region;
   etching the substrate along the first etched hole, to form a bit line contact hole; wherein the bit line contact hole exposes the active region;
   removing the first mask layer and the first conductive layer which are in the core region and located around the bit line contact hole, and retaining the first barrier layer located around the bit line contact hole; and
   forming a bit line contact in the bit line contact hole; wherein the bit line contact is electrically connected to the active region, and a surface of the bit line contact away from the substrate is flush with a surface of the first barrier layer away from the substrate.

2. The manufacturing method of a memory according to claim 1, wherein after the step of forming a first conductive layer and a first mask layer on the substrate in sequence, the manufacturing method of a memory further comprises:
   forming a second mask layer, a third mask layer, and an intermediate layer on the first mask layer in sequence; wherein the third mask layer in the core region has a filling hole penetrating through the third mask layer, and part of the intermediate layer is located in the filling hole;
   removing part of the intermediate layer in the core region and the third mask layer in the core region, and retaining the intermediate layer located in the filling hole; and
   etching and removing, by taking a retained intermediate layer as a mask, the second mask layer exposed in the core region.

3. The manufacturing method of a memory according to claim 2, wherein the step of removing part of the intermediate layer in the core region and the third mask layer in the core region, and retaining the intermediate layer located in the filling hole comprises:
   depositing a photoresist layer on the intermediate layer in the peripheral region, wherein the photoresist layer covers the intermediate layer;
   etching and removing, by taking the photoresist layer as a mask, the intermediate layer on the third mask layer in the core region; and
   etching and removing the third mask layer in the core region and the photoresist layer in the peripheral region, to expose the second mask layer in the core region and the intermediate layer in the peripheral region.

4. The manufacturing method of a memory according to claim 3, wherein the third mask layer comprises a first base layer located on the second mask layer, and a first anti-reflection layer located on the first base layer; and
   the step of etching and removing the third mask layer in the core region and the photoresist layer in the peripheral region, to expose the second mask layer in the core region and the intermediate layer in the peripheral region, comprises:
   etching and removing the first anti-reflection layer in the core region, to expose the first base layer in the core region; and etching and removing the first base layer in the core region and the photoresist layer in the peripheral region at the same time.

5. The manufacturing method of a memory according to claim 4, wherein an etch selectivity ratio of the first base layer to the intermediate layer is greater than or equal to 50; and when the first base layer in the core region and the photoresist layer in the peripheral region are etched and removed at the same time, a first etchant is oxygen, a first etching frequency is 60 MHz, and a first etching power is 1000 W to 1200 W.

6. The manufacturing method of a memory according to claim 2, wherein the step of forming a second mask layer, a third mask layer, and an intermediate layer on the first mask layer in sequence comprises:

depositing the second mask layer and the third mask layer on the first mask layer in sequence;

etching and removing part of the third mask layer in the core region, to form the filling hole; and depositing the intermediate layer in the filling hole and on the third mask layer.

7. The manufacturing method of a memory according to claim 2, wherein the second mask layer comprises a second base layer located on the first mask layer, and a second anti-reflection layer located on the second base layer; and the step of etching and removing, by taking a retained intermediate layer as a mask, the second mask layer exposed in the core region comprises:

etching and removing the second anti-reflection layer exposed in the core region, and etching and removing part of the intermediate layer in the core region and an entire intermediate layer in the peripheral region; and etching the second base layer by taking a remaining intermediate layer as a mask, to remove an exposed second base layer.

8. The manufacturing method of a memory according to claim 7, wherein an etch selectivity ratio of the intermediate layer to the second anti-reflection layer is 1, and a thickness of the intermediate layer is less than 1.2 to 1.3 times a thickness of the second anti-reflection layer, such that the intermediate layer is etched while the second anti-reflection layer is etched.

9. The manufacturing method of a memory according to claim 7, wherein when the second anti-reflection layer exposed in the core region is etched and removed, and part of the intermediate layer in the core region and the entire intermediate layer in the peripheral region are etched and removed, a second etchant comprises sulfur hexafluoride and difluoromethane, and a diluent is nitrogen or helium.

10. The manufacturing method of a memory according to claim 7, wherein the third mask layer comprises a first base layer located on the second mask layer, and a first anti-reflection layer located on the first base layer;

a thickness of the second base layer is greater than or equal to 1.3 to 1.5 times a thickness of the first base layer; and an etch selectivity ratio of the second base layer to the first anti-reflection layer is greater than or equal to 20, such that at least part of the first anti-reflection layer in the peripheral region is retained while the second base layer is etched.

11. The manufacturing method of a memory according to claim 7, wherein the third mask layer comprises a first base layer located on the second mask layer, and a first anti-reflection layer located on the first base layer; and after the step of etching the second base layer by taking a remaining intermediate layer as a mask, to remove an exposed second base layer, the manufacturing method of a memory further comprises:

removing the remaining intermediate layer, a remaining second anti-reflection layer in the core region, and the first anti-reflection layer in the peripheral region; and removing a remaining second base layer in the core region and the first base layer in the peripheral region at the same time.

12. The manufacturing method of a memory according to claim 11, wherein an etch selectivity ratio of the first base layer to the first mask layer is greater than or equal to 50, and an etch selectivity ratio of the first base layer to the second anti-reflection layer is greater than or equal to 50; and when the remaining second base layer in the core region and the first base layer in the peripheral region are removed at the same time, a third etchant is oxygen, a second etching frequency is 60 MHz, and a second etching power is 1000 W to 1200 W.

13. The manufacturing method of a memory according to claim 7, wherein the step of etching the first mask layer, the first conductive layer, and the first barrier layer which are in the core region, to form a first etched hole penetrating through the first mask layer, the first conductive layer, and the first barrier layer, wherein the first etched hole is opposite to the active region comprises:

etching the first mask layer, the first conductive layer, and the first barrier layer by taking the remaining intermediate layer as a mask, to form the first etched hole.

14. The manufacturing method of a memory according to claim 13, wherein the step of removing the first mask layer and the first conductive layer which are in the core region and located around the bit line contact hole, and retaining the first barrier layer located around the bit line contact hole further comprises:

removing a remaining first mask layer and a remaining first conductive layer in the core region, and removing the second anti-reflection layer in the peripheral region; and removing the second base layer in the peripheral region, to expose the first mask layer in the peripheral region.

15. The manufacturing method of a memory according to claim 1, wherein the step of forming a bit line contact in the bit line contact hole comprises:

depositing a second conductive layer in the bit line contact hole, on the first barrier layer in the core region, and on the first mask layer in the peripheral region;

etching and removing the second conductive layer on the first barrier layer in the core region and the second conductive layer in the peripheral region; and etching and removing the first mask layer in the peripheral region, to expose the first conductive layer in the peripheral region.

* * * * *